United States Patent
Pradeep et al.

(10) Patent No.: US 6,228,713 B1
(45) Date of Patent: May 8, 2001

(54) SELF-ALIGNED FLOATING GATE FOR MEMORY APPLICATION USING SHALLOW TRENCH ISOLATION

(75) Inventors: Yelehanka Ramachandramurthy Pradeep, Singapore (SG); Vijay Kumar Chhagan, Belgrave (GB); Jie Yu; Mei Sheng Zhou, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/342,035

(22) Filed: Jun. 28, 1999

(51) Int. Cl.[7] ................................................ H01H 21/336
(52) U.S. Cl. ........................ 438/257; 438/201; 438/211; 438/266; 438/294; 438/295; 438/296; 438/263; 438/264; 257/314; 257/315; 257/316; 257/317; 257/318; 257/319; 257/320
(58) Field of Search ..................................... 438/257, 266, 438/201–211, 259, 262–264, 296, 424; 257/369, 371, 438, 223, 224, 314–320

(56) References Cited

U.S. PATENT DOCUMENTS

| | | | |
|---|---|---|---|
| 5,208,179 | * 5/1993 | Ozakawa | 437/52 |
| 5,382,534 | 1/1995 | Sheu et al. | 437/35 |
| 5,554,550 | 9/1996 | Yang | 437/43 |
| 5,731,237 | * 3/1998 | Sato | 438/257 |
| 5,981,341 | * 11/1999 | Kim et al. | 438/264 |

* cited by examiner

Primary Examiner—Tom Thomas
Assistant Examiner—Nitin Parekh
(74) Attorney, Agent, or Firm—George O. Saile; Rosemary L. S. Pike; William J. Stoffel (57) ABSTRACT

A method to make a self-aligned floating gate in a memory device. The method patterns the floating gate (FG) using the trench etch for the shallow trench isolation (STI). Because the floating gate (FG) is adjacent to the raised STI, sharp corners are eliminated between the FG and CG thereby increasing the effectiveness of the intergate dielectric layer. The method includes: forming an first dielectric layer (gate oxide) and a polysilicon layer over a substrate, etching through the first dielectric oxide layer and the polysilicon layer and into the substrate to form a trench. The remaining first dielectric layer and polysilicon layer function as a tunnel dielectric layer and a floating gate. The trench is filled with an isolation layer. The masking layer is removed. An intergate dielectric layer and a control gate are formed over the floating gate and the isolation layer.

15 Claims, 8 Drawing Sheets

SELF-ALIGNED FLOATING GATE FOR MEMORY APPLICATION USING SHALLOW TRENCH ISOLATION

BACKGROUND OF INVENTION

1) Field of the Invention

This invention relates generally to fabrication of semiconductor memory devices and more particularly to the fabrication of a self aligned floating gate using Shallow trench isolation.

2) Description of the Prior Art

More efficient utilization of device area in VLSI technology is a prominent objective in order to increase the density and number of devices and memory cells on a semiconductor chip. This reduces cost and increase the speed of operation. A known technique is to place various elements, i.e., shallow trench isolation (STI), transistors, capacitors, etch in trenches to achieve greater element density.

A deficiency with current memory devices is the poor quality of the intergate dielectric layers between the floating gate (FG) and the control gate (CG) which causes low breakdown voltages. The inconsistent quality of the intergate dielectric layers worsens as the devices are further shrunk and the intergate dielectric layers are made thinner.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,382,534 (Sheu et al.) shows a method for forming a recessed SID regions. U.S. Pat. No. 5,554,550 (Yang) shows a method for forming a gate in a trench.

However there is still a need for an improved memory cell formation and isolation method.

SUMMARY OF THE INVENTION

It is an object of the present invention to provide a method for fabricating a memory device with improved intergate dielectric performance and increased floating gate (FG) to control gate (CG) breakdown voltage.

It is an object of the present invention to provide a method for fabricating a memory device which separates any corners of the floating gate (FG) and control gate (CG) layers to improve the intergate dielectric performance and increase floating gate (FG) to control gate (CG) breakdown.

It is an object of the present invention to provide a method for fabricating a memory device that defines the floating gate (FG) using the shallow trench isolation (STI) trench etch thereby reducing the masking and etching steps and creates a self-aligned structure.

To accomplish the above objectives, the present invention provides a method for patterning the poly gate and etching a shallow trench isolation (STI) trench in one mask/etch step.

The invention patterns the floating gate (FG) with the trench etch. The shallow trench isolation (STI) is formed above the top surface of the floating gate (FG). The corners of the floating gate (FG) are adjacent to the sidewalls of the shallow trench isolation (STI). Also, the corner of the control gate (CG) and are separated away from the floating gate (FG) corner. This separation of floating gate (FG) and control gate (CG) corners improves the stability, performance and reliability of the intergate dielectric layer (especially formed of ONO).

In slightly more detail, a preferred embodiment includes: providing a substrate having a cell area and a peripheral area. We form an first dielectric layer (gate oxide) and a first conductive layer (polysilicon layer) over the substrate. Then, a masking layer having first openings is formed over the conductive layer. The first opening defining isolation areas in the substrate where isolation regions will be formed. Using the masking layer as an etch mask, we etch through the first dielectric oxide layer and the conductive layer and into the substrate to form a trench. The remaining first dielectric layer and conductive layer comprise a tunnel dielectric layer and a floating gate of a memory device. The trench defining active regions and the isolation areas in the substrate. We fill the trench with an isolation layer to form isolation regions. We remove the masking layer; We deposit an intergate dielectric layer over the floating gate and the isolation layer. We form a second conductive layer (control gate layer) on the intergate dielectric layer over the floating gate. We pattern the second conductive layer, the intergate dielectric layer, the floating gate and the first dielectric layer to form memory gate structures comprising a control gate; a intergate dielectric; the floating gate; and the tunnel dielectric layer. We form doped regions in the substrate adjacent to the memory gate structures; thereby completing memory devices.

The invention has the following benefits:

no poly wrap around effect the shallow trench isolation (STI) 24 reduces the sharp corner effect of a LOCOS isolation method thereby improving the intergate dielectric (ONO) 30 layer performance.

reduce the probability of twin bit failure from the bottom gate by using the gap fill as isolation 24 due to no ONO fence formation. Usually Flash or EPROM are placed very close to use maximum silicon area. By a LOCOS method due to the ONO fence formed beside floating gate, the material of floating gate or controlled gate may get trapped and create an electrical short (Known as twin bit failure).

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A, 3A, 4A, 5A, and 6A are taken along axis A/A' in FIG. 1B.

FIGS. 2B, 3B, 4B, 5B, and 6B are taken along axis B/B' in FIG. 1B.

FIGS. 2, 3, 4, 5, and 6 are taken along axis A/A' in FIG. 1.

FIGS. 2B, 3B, 4B, 5B, and 6B are taken along axis B/B' in FIG. 1B.

DETAILED DESCRIPTION OF THE PREFERRED EMBODIMENTS

The present invention will be described in detail with reference to the accompanying drawings. The present invention provides a method for patterning the poly gate (FG) and etching a shallow trench isolation (STI) trench in one mask/etch step. See FIG. 3.

Problem of Sharp Edge between the Floating Gate (FG) and Control Gate (CG) in LOCOS Processes The inventors have found that current LOCOS isolation structures implemented on memory devices cause low breakdown voltage problems between the floating gate (FG) and control gate (CG).

Figure 1:
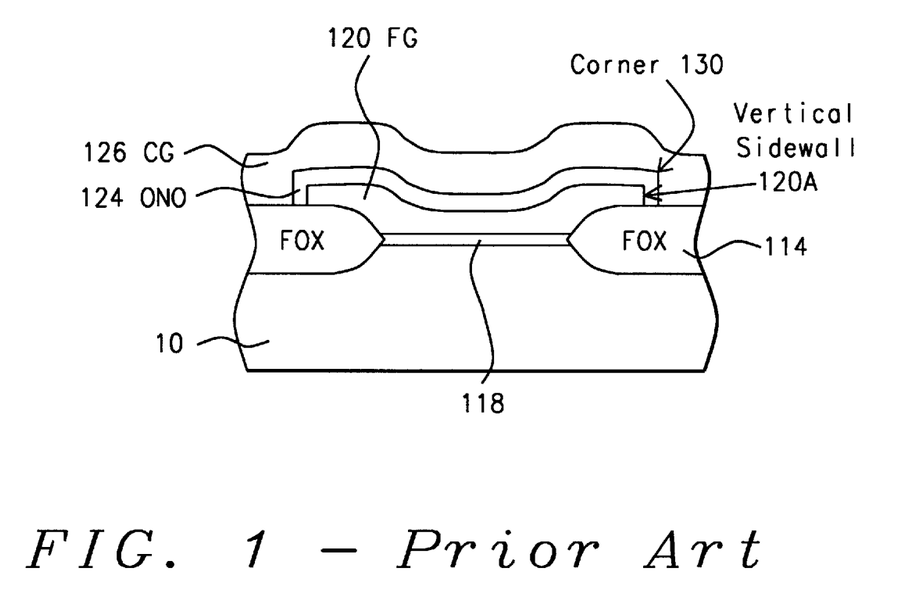
FIG. 1 is a cross sectional view for illustrating a method for manufacturing a memory device according to a prior art method.
Figure 1A:
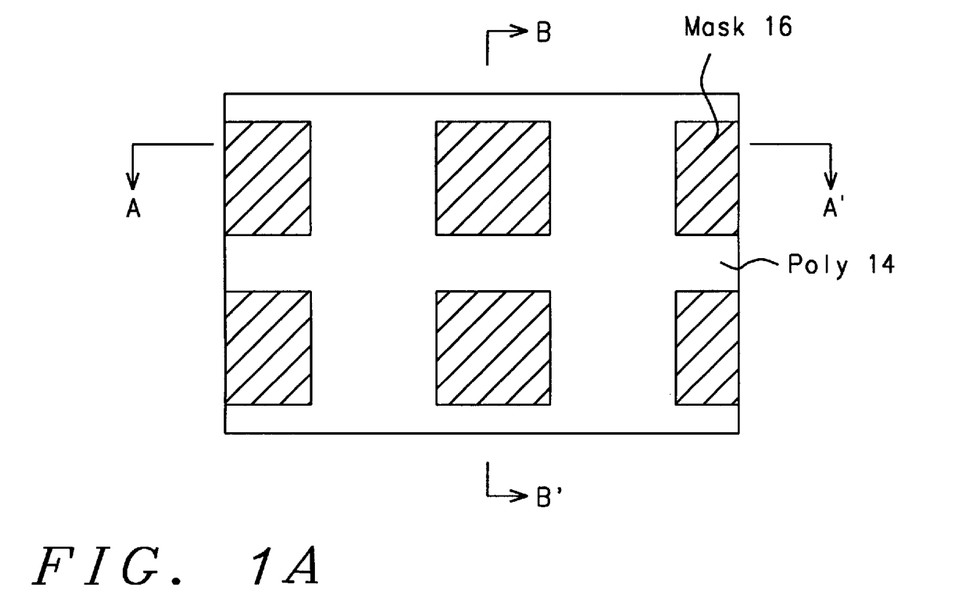
FIG. 1A is a top down view of a cell area on a substrate according to a preferred embodiment of the present invention.

FIG. 1A shows a LOCOS process as known by the inventors. FIG. 1A shows a gate oxide 118 on a substrate having LOCOS isolation regions 114. A floating gate (FG) 120 is formed and patterned over the gate oxide and LOCOS regions. Note that the floating gate (FG) has a sharp corner 130 adjacent to the control gate (CG) over the LOCOS region 114.

Next, intergate dielectric layer 124 preferably composed of silicon oxide/silicon nitride/silicon oxide (ONO) are then formed. Next, a control gate (CG) is formed thereover.

The inventors have found that the sharp corners 130 of the FG and overlying CG and the vertical sidewalls 120A cause breakdown 130 and leakage problems for the intergate dielectric layer 124, especially ONO layers. See FIG. 1.

A purpose of the invention is to eliminate this sharp corner of the FG and control gate. The invention also eliminates the sharp corner of the FG and isolation area.

Another shortcoming of the LOCOS isolation process is that the bird's peaks (at the corners of the Field oxide 114) cause leakage problems and use up valuable space.

Invention's Trench 20 Eliminates the Sharp Corners of Floating Gate (FG) 14

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

FIG. 1A is a top down view of a substrate according to a preferred embodiment of the present invention. FIGS. 2A, 3A, 4A, 5A, 6A and 7A are taken along axis A/A' in FIG. 1A. FIGS. 2B, 3B, 4B, 5B, 6B and 7B are taken along axis B/B' in FIG. 1A.

FIGS. 2C, 3C, 4C, 5C, and 6C are cross sectional views in a peripheral area (non-cell area) of the semiconductor device.

Figure 6A:
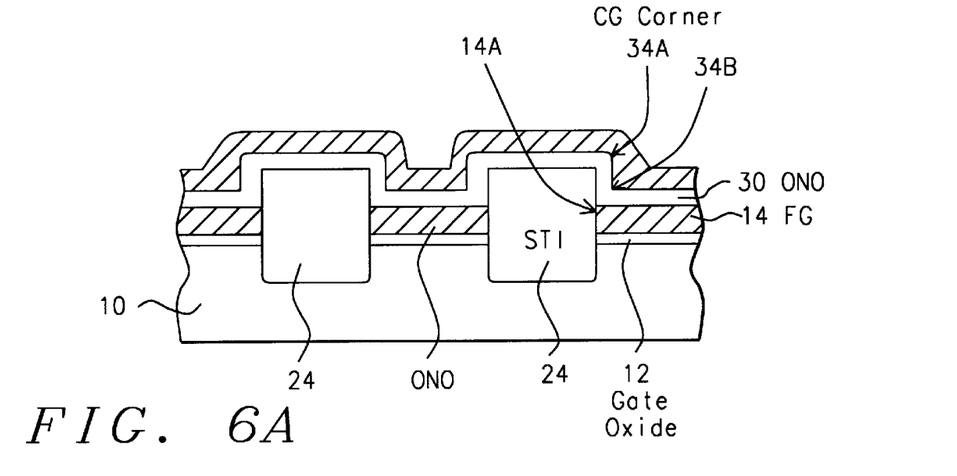
Figure 6B:
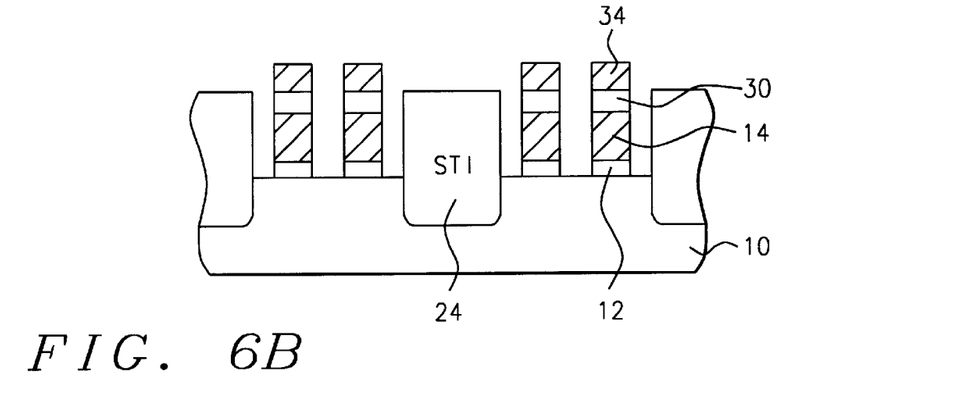

FIG. 6 is a top plan view for illustrating a method for manufacturing a semiconductor memory device according to the present invention. FIG. 6A is taken along axis 6A/6A' in FIG. 6. FIG. B is taken along axis 6B/6B' in FIG. 6.

Overview of the Invention

Figure 2A:
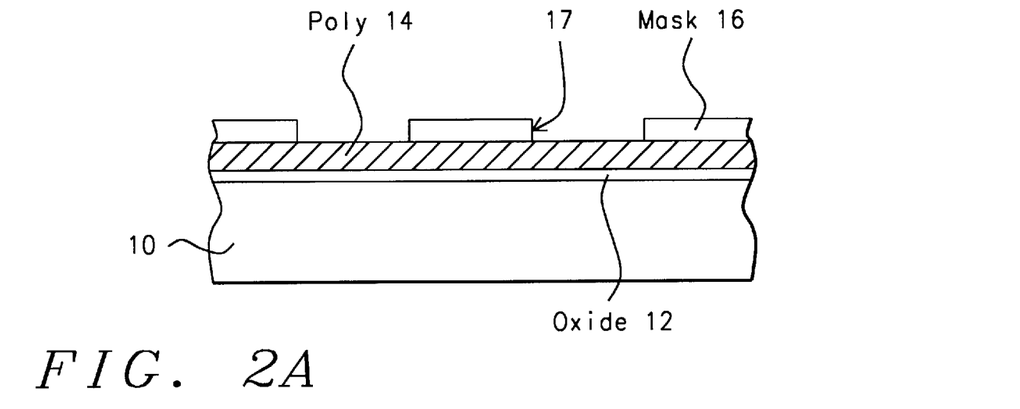
FIGS. 2A, 3A, 4A, 5A, 6A and 7A are cross sectional views of a cell area for illustrating a method for manufacturing a memory device according to the present invention.
Figure 2B:
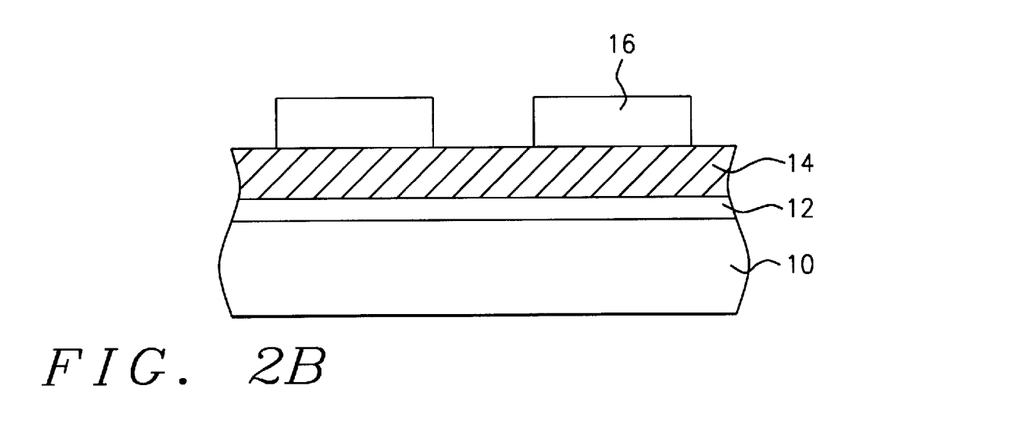
FIGS. 2B, 3B, 4B, 5B, 6B and 7B are cross sectional views a cell area for illustrating a method for manufacturing a memory device according to the present invention.
Figure 3A:
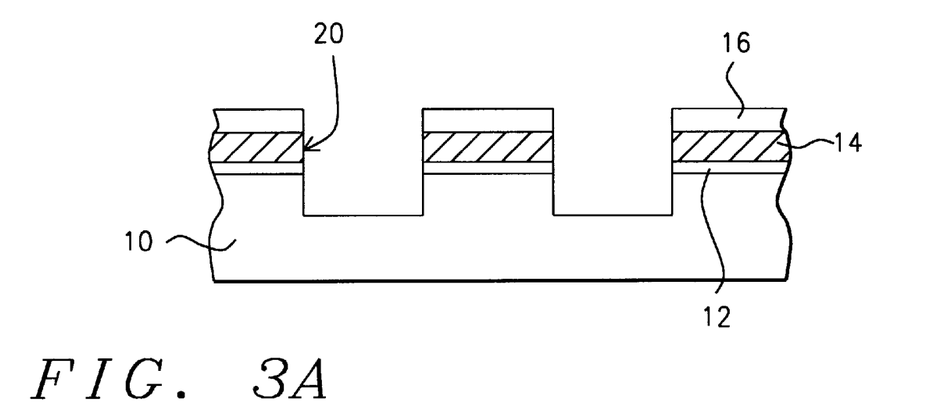
Figure 3B:
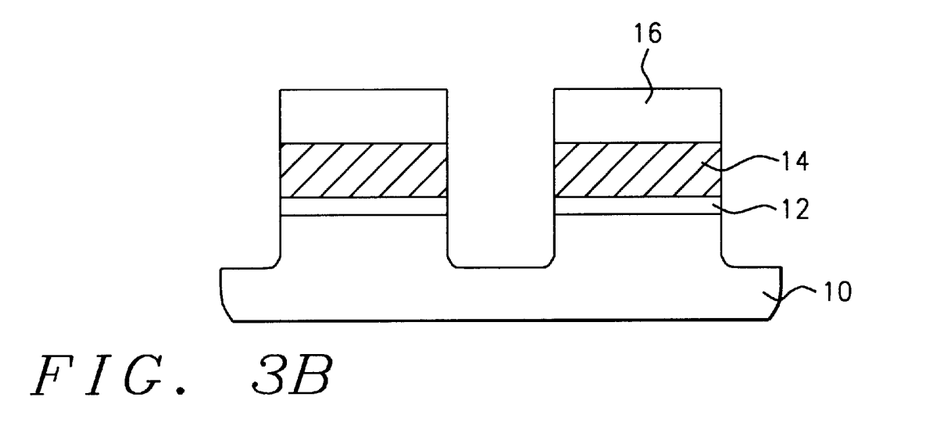
Figure 4A:
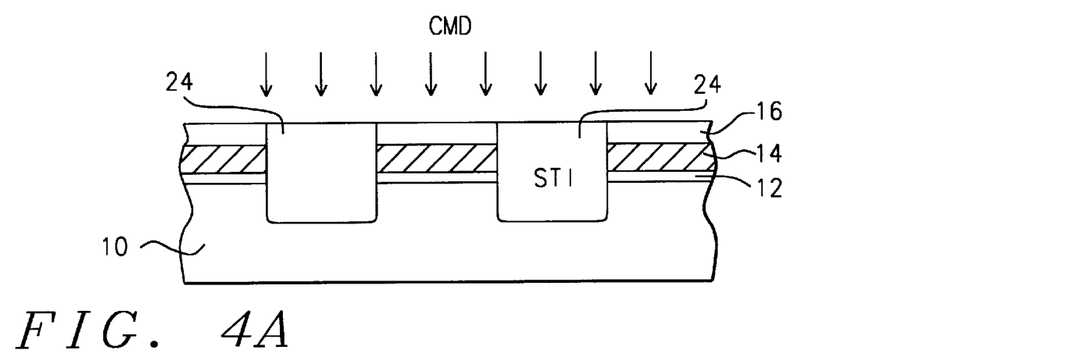
Figure 4B:
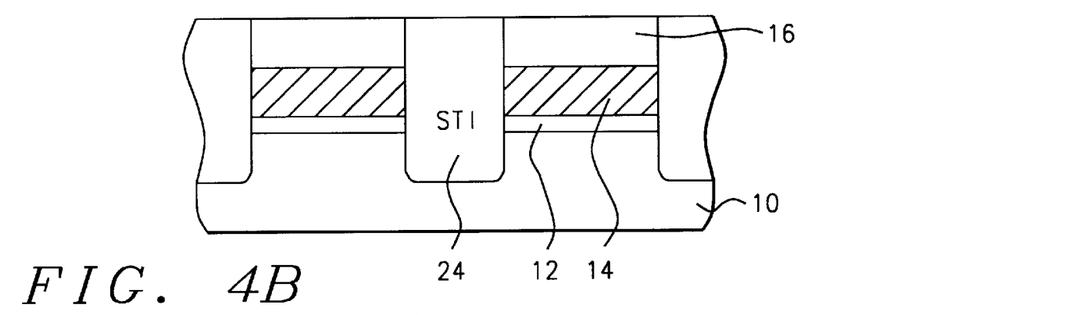
Figure 5A:
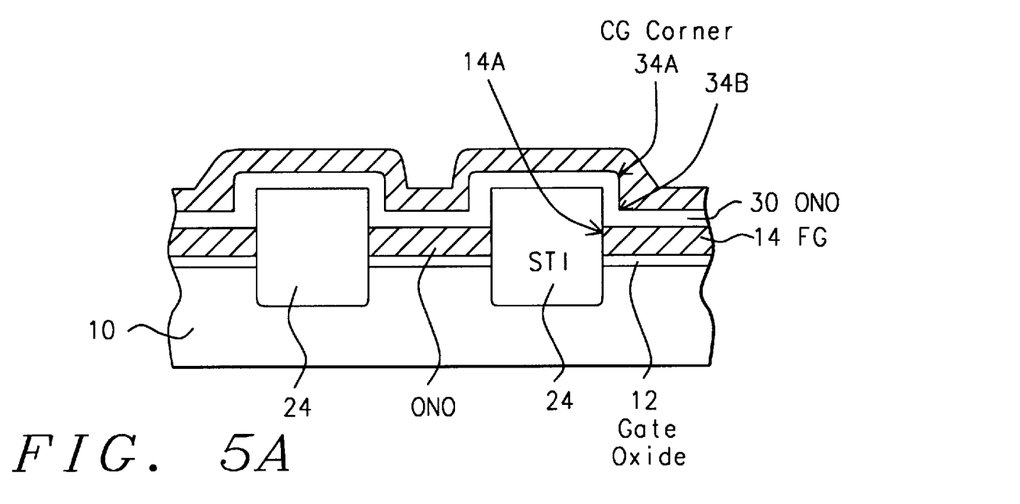
Figure 5B:
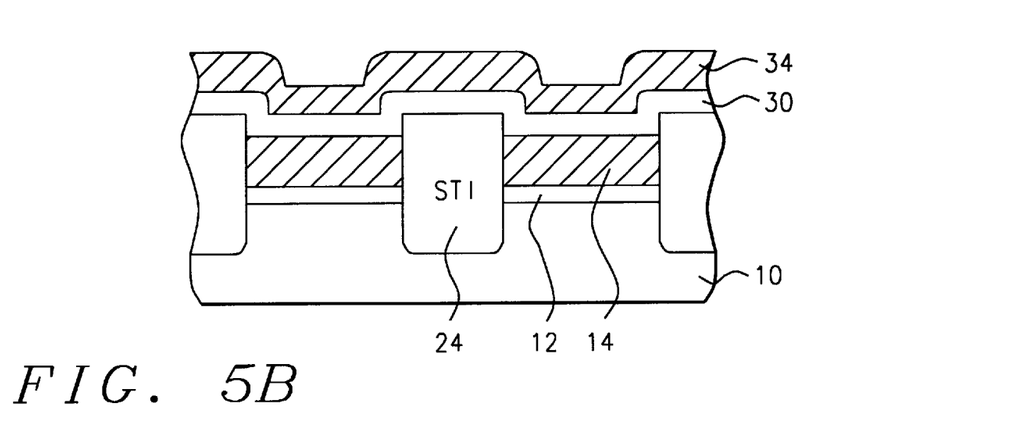
Figure 7A:
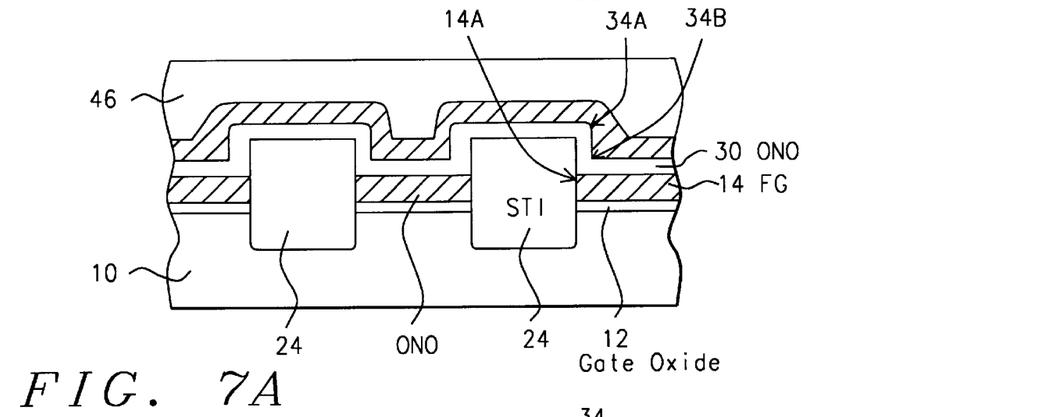
Figure 7B:
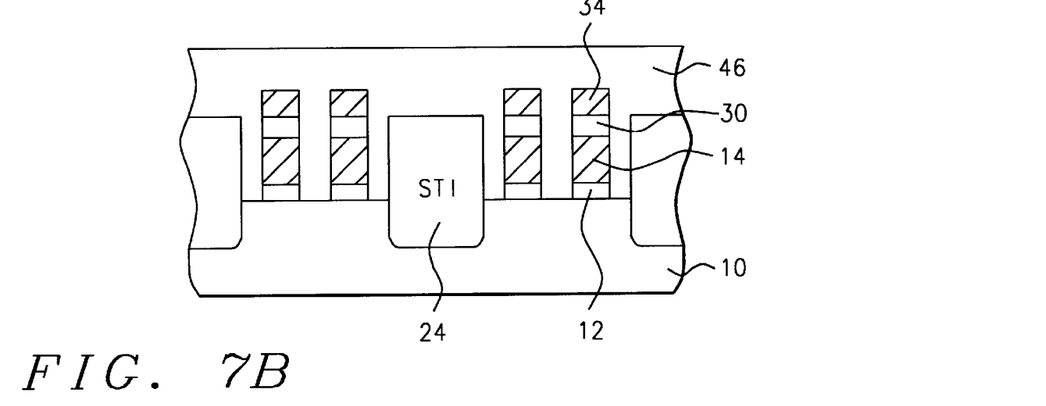

A preferred embodiment of the invention forms memory devices in cell areas and fet devices in peripheral areas (non-cell areas). An overview of the process follows:

a) provide a substrate 10 having a cell area and a peripheral area;

b) FIGS. 2A & 2B—form an first dielectric layer (gate oxide) 12 and a first conductive layer (polysilicon layer) 14 over the substrate 10;

c) form a masking Layer 16 having first openings 17 over the conductive layer 14; the first opening defining isolation areas in the substrate where isolation regions will be formed;

d) FIGS. 3A & 3B—using the masking layer 16 as an etch mask, etching through the first dielectric oxide layer 12 and the conductive layer 14 and into the substrate to form a trench 20; the remaining first dielectric layer 12 and conductive layer 14 comprise a tunnel dielectric layer 12 and a floating gate 14 of a memory device; the trench 20 defining active regions and the isolation areas in the substrate;

e) FIGS. 4A & 4B—fill the trench 20 with an isolation layer 24 to form isolation regions 24;

f) planarizing the isolation regions using a chemical-mechanical polish or etch back process;

g) FIGS. 5A & B—removing the masking layer 16;

h) removing the a tunnel dielectric layer 12 and a floating gate 14 in the peripheral areas;

i) FIGS. 5A and 5B—form an intergate dielectric layer 30 over the floating gate 14 and the isolation layer 24 in the cell area;

j) form a gate dielectric layer on the substrate in the peripheral areas;

k) form a second conductive layer (control gate layer) 34 on the intergate dielectric layer 30 over the floating gate in the cell area and over the gate dielectric layer 32 in the peripheral areas;

l) FIGS. 6A & 6B pattern the second conductive layer (control gate (CG)) 34, the intergate dielectric layer 30, the floating gate (FG) and the first dielectric layer 12 to form memory gate structures 12 14 30 34 in the cell area comprising a control gate (CG) 34; a intergate dielectric 30 ; the floating gate (FG); and the tunnel dielectric layer 12; and in the peripheral areas, patterning the second conductive layer and the gate dielectric layer to form gate structures 32 34;

m) FIGS. 7A & 7B—form doped regions in the substrate adjacent to the memory gate structures; thereby completing memory devices and forming doped regions 43 adjacent to the gate structures to form FET devices in the peripheral areas.

First Dielectric Layer 12 and Conductive Layer 14

Figure 2C:
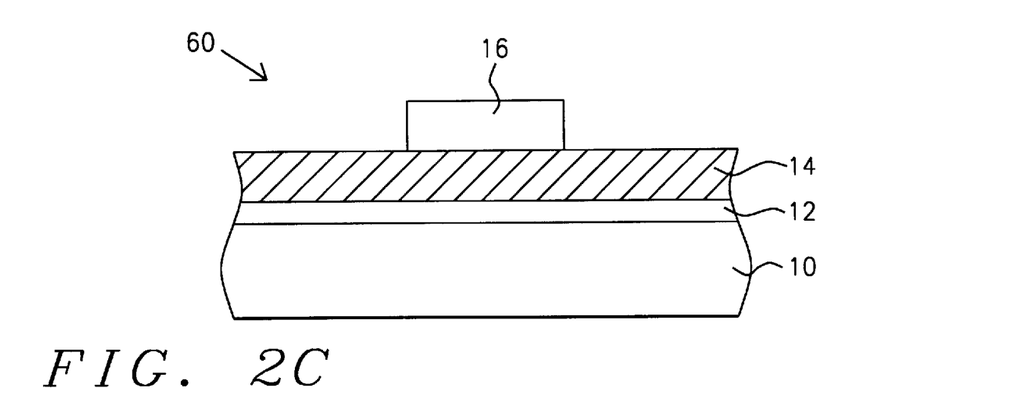
FIGS. 2C, 3C, 4C, 4D, 5C, 6C and 7C are cross sectional views in a peripheral area (non-cell area) of a semiconductor device for illustrating a method for manufacturing a memory device according to the present invention.

FIGS. 2A, 2B and 2C shows the step of forming an first dielectric layer (gate oxide) 12 and a polysilicon layer 14 (conductive layer ) over a substrate 10.

Substrate 10 is understood to possibly include a semiconductor wafer, active and passive devices formed within the wafer and layers formed on the wafer surface. The term "substrate" is mean to include devices formed within a semiconductor wafer and the layers overlying the wafer.

The first dielectric layer 12 (also called gate oxide or tunnel oxide) is preferably composed of silicon oxide and preferably has a thickness of between about 50 and 200 Å. The first dielectric layer is not limited to oxides and can be formed of other materials.

The conductive layer 14 can be formed of amorphous silicon, polycide or polysilicon and is most preferably formed of polysilicon and preferably has a thickness of between about 800 and 2000 Å.

Masking Layer 18

As shown in FIGS. 2A and 2B, a masking layer 16 (etch mask or CMP mask) is formed on the polysilicon layer 14. The masking layer is patterned using conventional photoresist and etching steps. The masking layer has first openings 17 over the polysilicon layer 14. The first opening define isolation areas in the substrate where shallow trench isolation (STI) isolation regions will be formed. The substrate also contains active areas which comprise all other areas that are not isolation areas.

The masking layer can be composed of silicon nitride, $Si_xO_yN_z$ (Silicon oxynitride) or a combination of silicon nitride and oxide, and is preferably composed of silicon nitride (SiN) having a thickness of between about 1000 and 2500 Å.

Trench 20

Figure 3C:
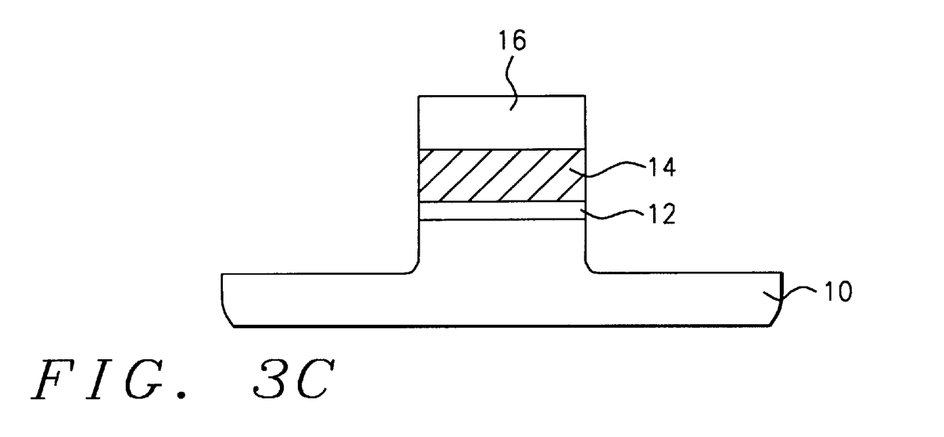

FIGS. 3A, 3B and 3C show the key step of forming a trench 20 that defines the floating gate 14. Using the masking layer 16 as a etch mask, we etch through the first dielectric oxide layer 12 and the polysilicon layer 14 and into the substrate to form a trench 20. The trench 20 preferably has a width in a range of between about 0.2 μm and 10 μm and preferably a depth in a range of between about 2000 and 4500 Å.

The remaining first dielectric layer 12 and polysilicon layer 14 forming a tunnel dielectric layer 12 and a floating gate 14. The trench 20 defining active regions and the isolation areas. The active area 20 preferably has a width of between about 0.3 μm and >10 μm and more preferably between 0.3 and 10 μm.

This novel trench etch step eliminates the sharp corners between the floating gate (FG) 14 and the subsequently formed control gate (CG). See FIG. 5.

Isolation Layer 24—FIGS. 4A & 4B

Figure 4C:
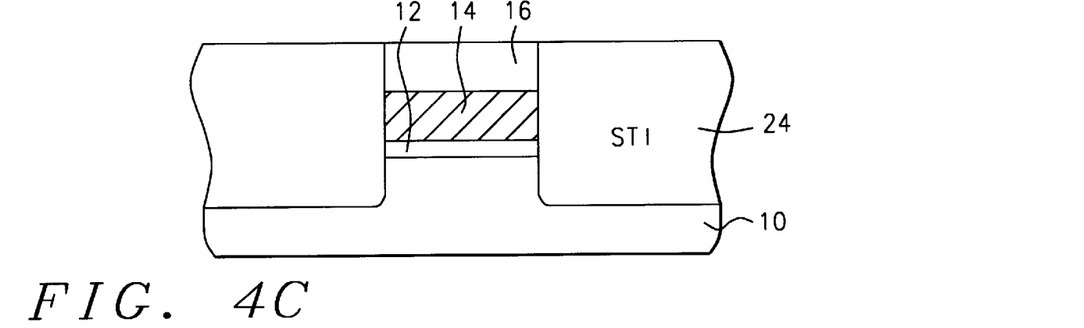

FIGS. 4A, 4B and 4C shows the step of filling the trench 20 with an isolation layer 24. The trench 20 is preferably filled with an isolation layer 24 composed of silicon oxide. The isolation layer can be formed using a deposition technique such as a SACVD, LPCVD, etc.

Next, the isolation layer is planarized preferably so that the top surface of the isolation layer 24 is even with the top surface of the (SiN) masking layer 16. The isolation layer is preferably planarized by a chemical-mechanical polish (CMP) using the masking layer 16 as a CMP stop. The isolation layer can also be planarized by an etch back or other suitable planarization technique.

FIGS. 5A & 5B—Remove the Masking Layer 16.

Figure 5C:
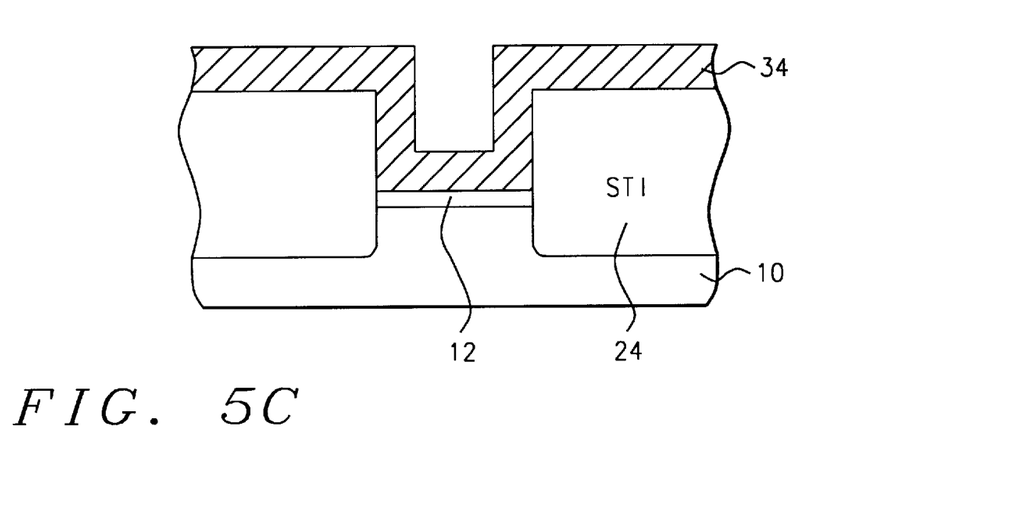

FIGS. 5A & 5B & 5C shows the step of removing the masking layer 16. The masking layer is preferably removed using a selective etch.

FIGS. 5A & 5B—Intergate Dielectric Layer 30

Next, we deposit an intergate dielectric layer 30 over the floating gate 14 and the isolation layer 24. The intergate dielectric layer 30 is preferably composed of a three layers (ONO) of a lower oxide layer, a middle nitride layer; and a top oxide layer.

In a preferred embodiment, the lower Oxide and middle nitride layers are formed over the substrate in both the cell and peripheral areas. The cell area is masked and the lower Oxide and middle nitride are then removed from the peripheral areas along with the first dielectric layer 12 and the control gate (CG) layer 34. See FIG. 5C.

The top oxide layer can also be formed on the peripheral areas to serve as the gate oxide layer 32 (gate oxide—2) for the devices 32 34 43 in the peripheral areas. See FIG. 6C.

The intergate dielectric layer 30 preferably has a total thickness of between about 100 and 400 Å.

Control Gate 34

Next, a control gate 34 is formed on the intergate dielectric layer 30 over the floating gate thereby forming a memory device.

The control gate 34 is preferably composed of polycide or polysilicon and is most preferably composed of polysilicon. The control gate preferably has a thickness of between about 1500 and 3500 Å.

The invention patterns the floating gate (FG) 14 with the trench etch. See FIG. 3A & 3B. The shallow trench isolation (STI) 24 is formed above the top surface of the floating gate (FG) 14. See FIGS. 5A & 5B. The corners of the floating gate (FG) 14 are adjacent to the sidewalls of the shallow trench isolation (STI) 14. Also, the corner 34A of the control gate (CG) 34A and 34B are spaced away from the floating gate (FG) corner 14A. See FIG. 5. This separation of floating gate (FG) and control gate (CG) corners improves the stability, performance and reliability of the intergate dielectric layer 30 (especially formed of ONO).

The invention provides the following advantages:
no polysilicon wrap around at the STI edge
no overlap between the floating gate and isolation area
No ONO stringers beside the floating gate

FIG. 8—Top View

Figure 8:
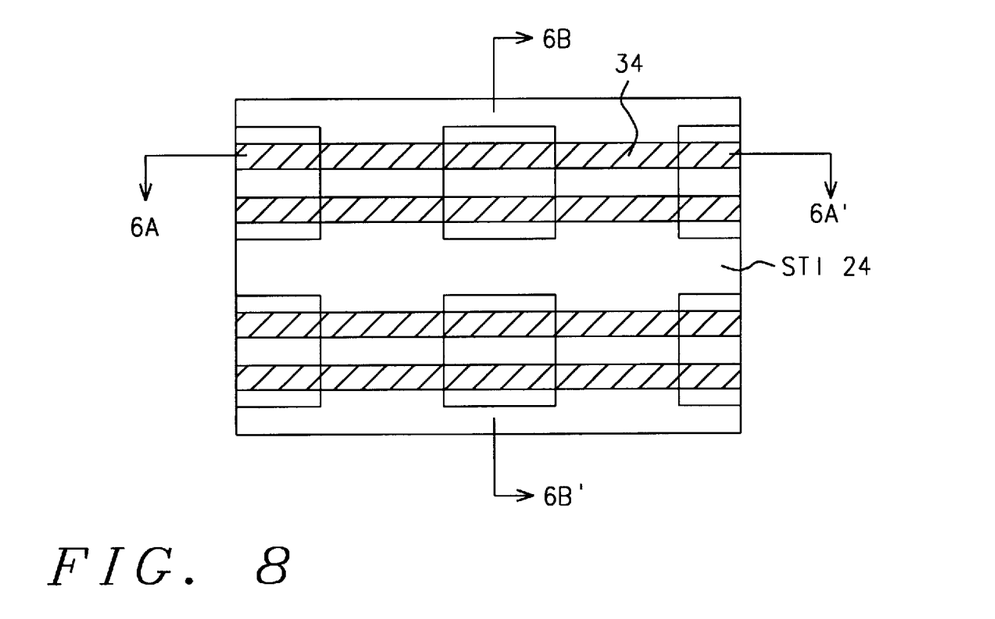
FIG. 8 is a top plan view for illustrating a method for manufacturing a semiconductor memory device according to the present invention.

FIG. 8 shows a top down view of the invention's memory cell after the control gates 34 are patterned.

FIG. 7B is a cross sectional view taken along axis 6B/6B' in FIG. 8 showing the formation of doped regions 42 in the substrate adjacent to the gate structures and the formation of a dielectric layer 46 thereover. FIG. 7A is a cross sectional view taken along axis 6B/6B' in FIG. 8.

Figure 7C:
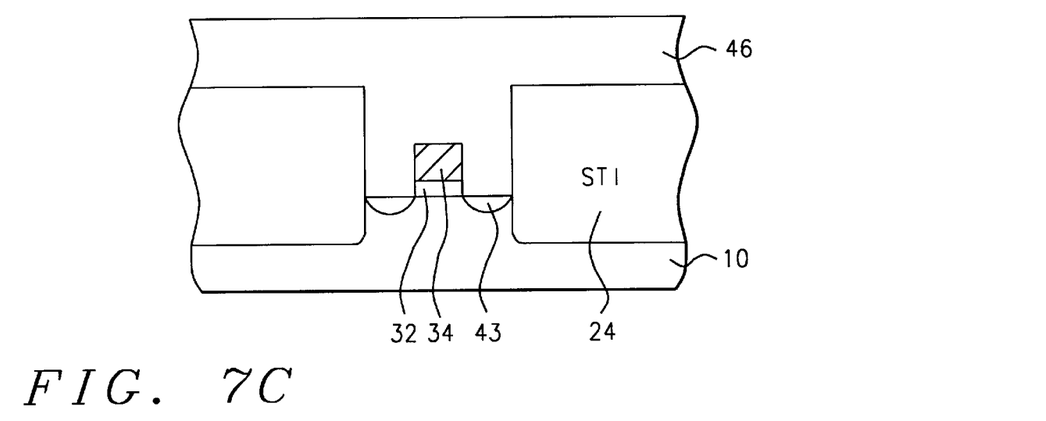

FIG. 7C is a cross sectional view in the peripheral area showing the formation of the S/D regions 43 and the dielectric layer 46.

FIGS. 2C thru 7C show Cross Sections in the Peripheral Areas

FIGS. 2c thru 7C cross sectional views in the peripheral areas (non-cell area) showing the formation of devices. The formation processes shown in the 2C correspond to the process shown in FIGS. 2A and 2B (cell areas). The formation processes shown in the 3C correspond to the process shown in FIGS. 3A and 3B (cell areas). The formation steps shown in 4C correspond to the process shown in FIGS. 4A and 4B (cell areas).

Figure 4D:
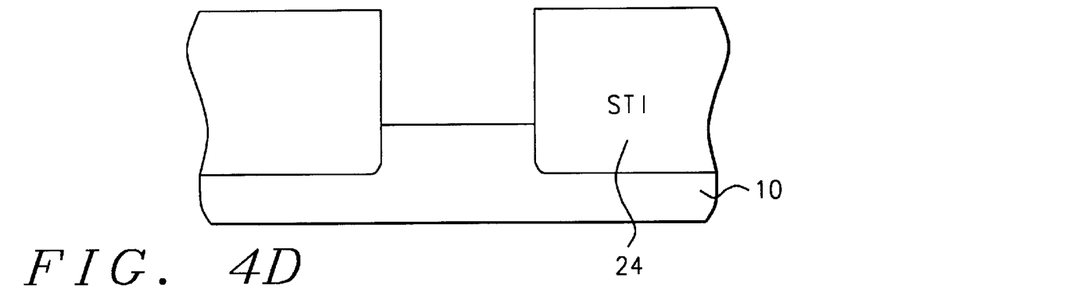

FIG. 4D shows the additional step to remove the FG material in the peripheral area.

FIG. 5C shows the formation of the gate oxide—2 in the peripheral areas, and the deposition of the control gate (CG) 34 thereover to form a FET device. The CG is patterned to form a gate structure. Next, source and drain regions are formed adjacent to the gate structures in the peripheral areas, preferably in the same process steps used in the cell areas. Next, a dielectric layer is formed over the entire substrate and contacts are formed to the source/drain regions and conductive structures (e.g., control gate (CG), gates and wordlines).

Figure 6C:
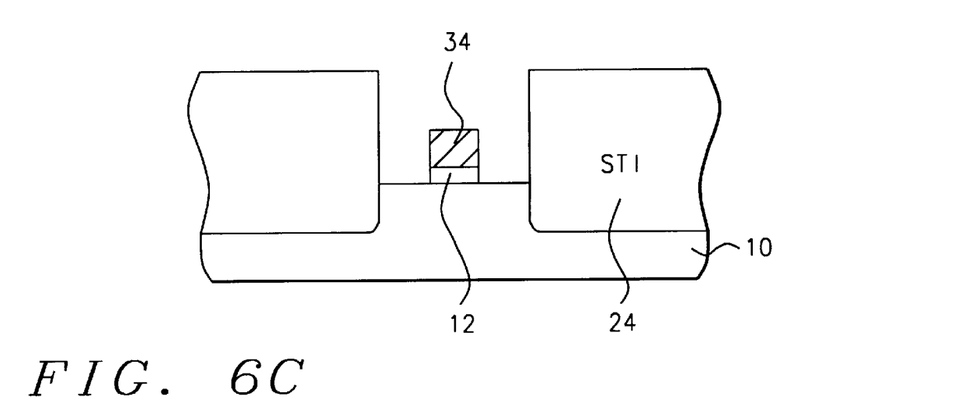

FIG. 6C shows the patterning of the gate 34 and gate oxide 32.

FIG. 7C is a cross sectional view in the peripheral area showing the formation of the S/D regions 43 and the dielectric layer 46.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication self-aligned floating gate in a memory device on a cell area on a substrate; said substrate having a cell area and a peripheral area; comprising the steps of:
   a) forming an first dielectric layer and a first conductive layer over said substrate;
   b) forming a masking layer over said conductive layer; patterning said masking layer to form first openings through said masking layer; said first opening defining isolation areas in said substrate where isolation regions will be formed;
   c) using said masking layer as an etch mask, etching through said first dielectric oxide layer and said conductive layer and into said substrate to form a trench; the remaining first dielectric layer and conductive layer comprise a tunnel dielectric layer and a floating gate of a memory device whereby said floating gate is not over said isolation areas; said trench defining active regions and said isolation areas in substrate; said trench is formed in said isolations areas; said active regions comprise the substrate areas that are not isolation areas;
   d) filling said trench with an isolation layer to form isolation regions;
   e) removing said masking layer;
   f) depositing an intergate dielectric layer over said floating gate and said isolation layer;
   g) forming a second conductive layer on said intergate dielectric layer over said floating gate;
   h) patterning said second conductive layer, said intergate dielectric layer, said floating gate and said first dielectric layer to form memory gate structures comprising a control gate; a intergate dielectric; said floating gate; and said tunnel dielectric layer; whereby said floating gate does not overlay said isolation regions;
   i) forming doped regions in said substrate adjacent to said memory gate structures; thereby completing memory devices.

2. The method of claim 1 which further includes after step (d) planarizing said isolation regions and said masking layer using a chemical-mechanical polish or etch back process.

3. The method of claim 1 wherein said first dielectric layer composed of silicon oxide having a thickness of between about 50 and 200 Å; said first conductive layer has a thickness of between about 800 and 2000 Å.

4. The method of claim 1 wherein said masking layer is composed of silicon nitride having a thickness of between about 1000 and 2500 Å.

5. The method of claim 1 wherein said trench has a width in a range of between about 0.2 and 10 $\mu$m and a depth in a range of between about 2000 and 4500 Å; said active area having a width of between about 0.3 and 10 $\mu$m.

6. The method of claim 1 wherein filling said trench with an isolation layer is composed of silicon oxide and chemical-mechanical polishing said isolation layer using said masking layer as a stop.

7. The method of claim 1 wherein said intergate dielectric layer is composed of a three layers of a lower oxide layer, a middle nitride layer; and a top oxide layer; said intergate dielectric layer has a thickness of between about 100 and 400 Å.

8. The method of claim 1 wherein said control gate is composed of polycide or polysilicon and has a thickness of between about 1500 and 3500 Å.

9. A method of fabrication self-aligned floating gate in a memory device in a cell area of a substrate and form devices on peripheral areas of said substrate; comprising the steps of:
   a) providing a substrate having a cell area and a peripheral area;
   b) forming an first dielectric layer and a first conductive layer over said substrate;
   c) forming a masking layer over said conductive layer; patterning said masking layer to form first openings through said masking layer; said first opening defining isolation areas in said substrate where isolation regions will be formed;
   d) using said masking layer as an etch mask, etching through said first dielectric layer and said conductive layer and into said substrate to form a trench; the remaining first dielectric layer and conductive layer comprise a tunnel dielectric layer and a floating gate of a memory device whereby said floating gate is not over said isolation areas; said trench defining active regions and said isolation areas in said substrate; said trench is formed in said isolations areas; said active regions comprise the substrate areas that are not isolation areas;
   e) filling said trench with an isolation layer to form isolation regions;
   f) planarizing said isolation regions using a chemical-mechanical polish or etch back process;
   g) removing said masking layer;
   h) removing said a tunnel dielectric layer and a floating gate in said peripheral areas;
   i) forming an intergate dielectric layer over said floating gate and said isolation layer in said cell area;
   j) forming a gate dielectric layer on said substrate in said peripheral areas;
   k) forming a second conductive layer on said intergate dielectric layer over said floating gate in said cell area and over said gate dielectric layer in said peripheral areas;
   l) patterning said second conductive layer, said intergate dielectric layer, said floating gate and said first dielectric layer to form memory gate structures in said cell area comprising a control gate; a intergate dielectric; said floating gate; and said tunnel dielectric layer; whereby said floating gate does not overlay said isolation regions, and in said peripheral areas, patterning said second conductive layer and said gate dielectric layer to form gate structures;
   m) forming doped regions in said substrate adjacent to said memory gate structures; thereby completing memory devices in said cell area; and forming doped regions adjacent to said gate structures to form FET devices in said peripheral areas; the steps (a) to (m) are performed in the order listed.

10. The method of claim 9 wherein said first dielectric layer composed of silicon oxide having a thickness of between about 50 and 200 Å; said first conductive layer is composed of polysilicon and has a thickness of between about 800 and 2000 Å.

11. The method of claim 9 wherein said masking layer is composed of silicon nitride having a thickness of between about 1000 and 2500 Å.

12. The method of claim 9 wherein said trench has a width in a range of between about 0.2 and 10 μm and a depth in a range of between about 2000 and 4500 Å; said active area having a width of between about 0.3 and 10 μm.

13. The method of claim 9 wherein filling said trench with an isolation layer is composed of silicon oxide and chemical-mechanical polishing said isolation layer using said masking layer as a stop.

14. The method of claim 9 wherein said intergate dielectric layer is composed of three layers of a lower oxide layer, a middle nitride layer; and a top oxide layer; said intergate dielectric layer has a thickness of between about 100 and 400 Å.

15. The method of claim 9 wherein said control gate is composed of polycide or polysilicon and has a thickness of between about 1500 and 3500 Å.

\* \* \* \* \*